(12) United States Patent
Huemoeller et al.

(10) Patent No.: US 6,534,391 B1
(45) Date of Patent: Mar. 18, 2003

(54) SEMICONDUCTOR PACKAGE HAVING SUBSTRATE WITH LASER-FORMED APERTURE THROUGH SOLDER MASK LAYER

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/932,528

(22) Filed: Aug. 17, 2001

(51) Int. Cl.[7] .................................................. H01L 21/44
(52) U.S. Cl. ........................................ 438/612; 438/126
(58) Field of Search .............................. 438/106, 107, 438/108, 110, 113, 122, 124, 126, 127, 612

(56) References Cited

U.S. PATENT DOCUMENTS 5,364,736 A * 11/1994 Eramo, Jr. et al.
5,987,744 A * 11/1999 Lan et al.
6,326,244 B1 * 12/2001 Brooks et al.
6,338,985 B1 * 1/2002 Greenwood

OTHER PUBLICATIONS

IBM TDB, Nov. 1993, vol. 36, issue 11, p. 589.

* cited by examiner

Primary Examiner—David Nelms
Assistant Examiner—Phuc T. Dang
(74) Attorney, Agent, or Firm—Skjerven Morrill LLP; James E. Parsons

(57) ABSTRACT

A semiconductor package and a method and a substrate for making the package are disclosed. The substrate of an exemplary package includes metal circuit patterns covered by a layer of an insulative nonphotoimageable solder mask material. A plurality of apertures are formed by laser ablation through the nonphotoimageable solder mask layer so as to expose a selected region of at least some of the circuit patterns. A bond wire is electrically connected between a semiconductor chip connected to the substrate and the respective circuit patterns through the laser-formed aperture over the circuit pattern.

27 Claims, 2 Drawing Sheets

SEMICONDUCTOR PACKAGE HAVING SUBSTRATE WITH LASER-FORMED APERTURE THROUGH SOLDER MASK LAYER

BACKGROUND

1. Technical Field

The present invention relates to an interconnective substrate having a solder mask layer, e.g., a substrate in a semiconductor package.

2. Related Art

Certain types of conventional semiconductor packages, such as ball grid array (BGA) packages, include an internal substrate having top and bottom surfaces. The substrate includes a core insulative sheet, and a patterned layer of metal on each of the top and bottom surfaces. The patterned metal layer on the top surface of the insulative sheet includes a central rectangular chip pad and a plurality of metal circuit patterns radiating from the die pad. Each of the circuit patterns includes an inner bond finger adjacent to the die pad. The patterned metal layer on the opposite bottom surface of the insulative sheet also includes a plurality of metal circuit patterns, each of which terminates at a round land. Metal-lined vias extend vertically through the substrate and electrically connect the metal traces on the top and bottom surfaces of the sheet. A layer of an epoxy-based photoimageable solder mask material is applied over the top and bottom metal layers. The bond fingers, lands, and chip pad are exposed through chemically etched openings in the solder mask. A semiconductor chip is attached to the chip pad. A plurality of bond wires electrically connect each of the bond pads of the chip to respective ones of the bond fingers. A body of a hardened insulative molded encapsulant material covers the chip and the bond wires, and all or part of the top surface of the substrate. Solder balls may be fused to the lands of the bottom surface of the substrate. The solder balls, therefore, are electrically connected to the chip through the metal traces, vias, and bond wires.

The solder mask material is an insulative photoimageable epoxy-based material. A portion of the composition solder mask material, e.g., about 10 percent of the solder mask material, consists of acrylates and photoinitiators that allow the solder mask material to be patterned by photolithography. The solder mask is applied over the entire area of the top and bottom surfaces of the substrate, including over the respective layers of patterned metal, i.e., over the chip pad and current patterns. Subsequently, the solder mask material is hardened by curing. After curing, the top and bottom layers of the photoimageable solder mask material are respectively exposed to light through a silver halide contact mask that includes apertures corresponding to the locations of the chip pad and bond fingers for the top metal layer, and the lands for the bottom metal layer. Subsequently, a chemical development solution is applied, and the portions of the photoimageable solder mask that were not exposed to light through the apertures of the mask, i.e., the chip pad, bond fingers, and lands, are removed. Accordingly, the die pad, bond fingers, and lands are exposed through the etched apertures of the solder mask so as to be accessible the subsequent steps of chip attachment, bond wiring, and solder ball attachment.

A drawback of the photoimageable solder mask used in the above conventional process is that it is brittle due to the presence of the acrylates and photoinitiators. These materials are necessary, however, to enable the mask to be patterned by photolithography. Because the solder mask material is brittle, the solder mask material tends to crack when it is subjected to thermal stresses associated with the encapsulation process and operation of the chip in the package. Such cracks can lead to moisture penetration of the package and delamination of the solder mask from the encapsulant. Hence, conventional photoimageable solder mask materials can lead to failure of the package.

SUMMARY OF THE INVENTION

The present invention includes an interconnective substrate and methods of making such a substrate, wherein an outer surface of the substrate includes a layer of an insulative solder mask material over selected portions of a plurality of conductive (e.g., metal) circuit patterns. In one application, the substrate may be used to make a semiconductor package for housing a semiconductor chip, e.g., a ball grid array package or a land grid array package. Alternatively, a circuit board upon which a semiconductor package is mounted (e.g., a mother board in a personal computer) may be made formed by the methods of the present invention.

An exemplary method of making such an interconnective substrate includes providing an insulative sheet including a plurality of first circuit patterns on a first surface thereof. A layer of an insulative nonphotoimageable solder mask material is applied over the first circuit patterns. A plurality of apertures are formed through the nonphotoimageable solder mask layer using a laser so as to expose a selected region of at least some of the first circuit patterns. The exposed portion of the first circuit pattern may subsequently be electrically connected, through a bond wire or a solder ball, to an input/output terminal of a semiconductor chip that is mounted on the substrate or of a package mounted on the substrate.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Exemplary embodiments of the present invention are described herein. Practitioners will appreciate, however, that our invention is not limited to these exemplary embodiments.

Figure 1:
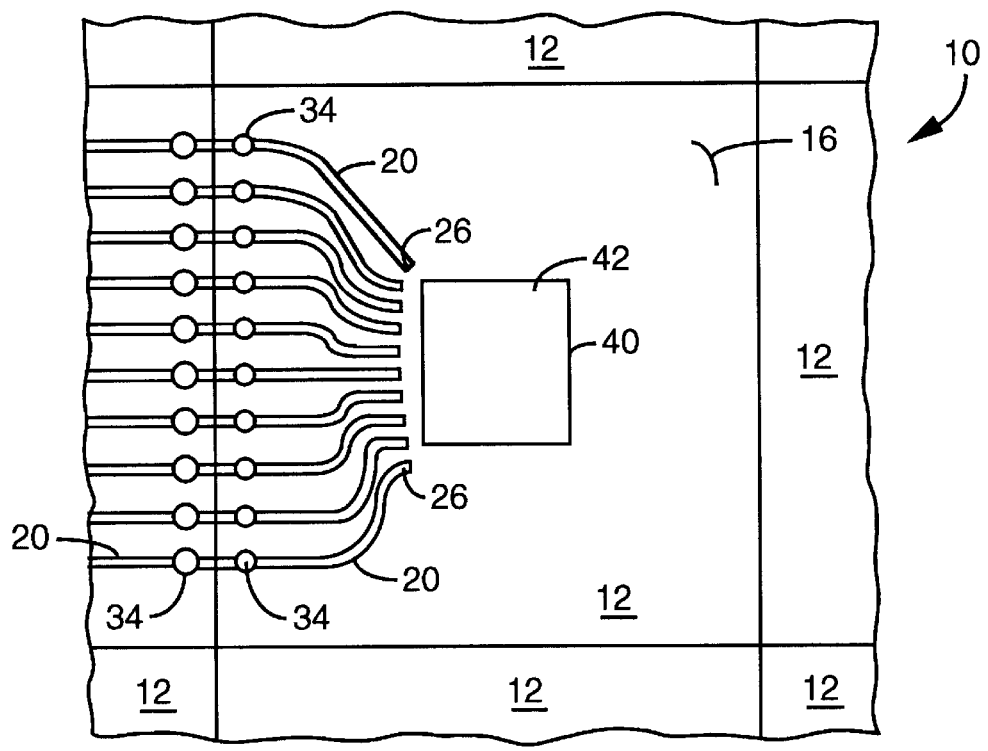
FIG. 1 is a top plan view of a substrate sheet including rows and columns of interconnected package substrates.
Figure 2:
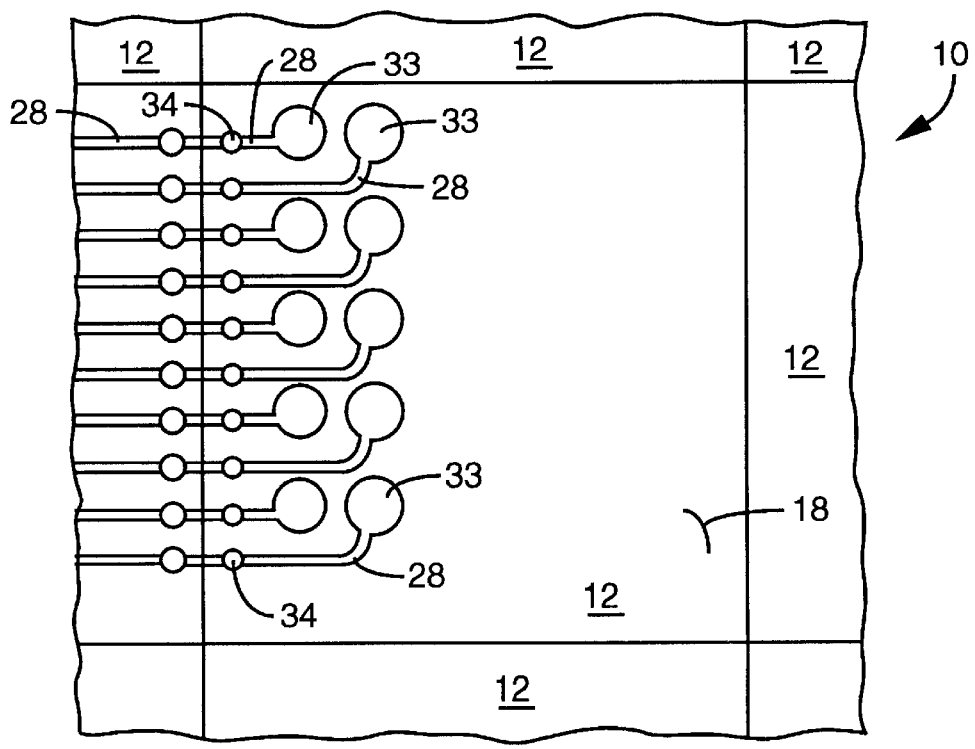
FIG. 2 is a bottom plan view of the substrate sheet of FIG. 1.
Figure 3:
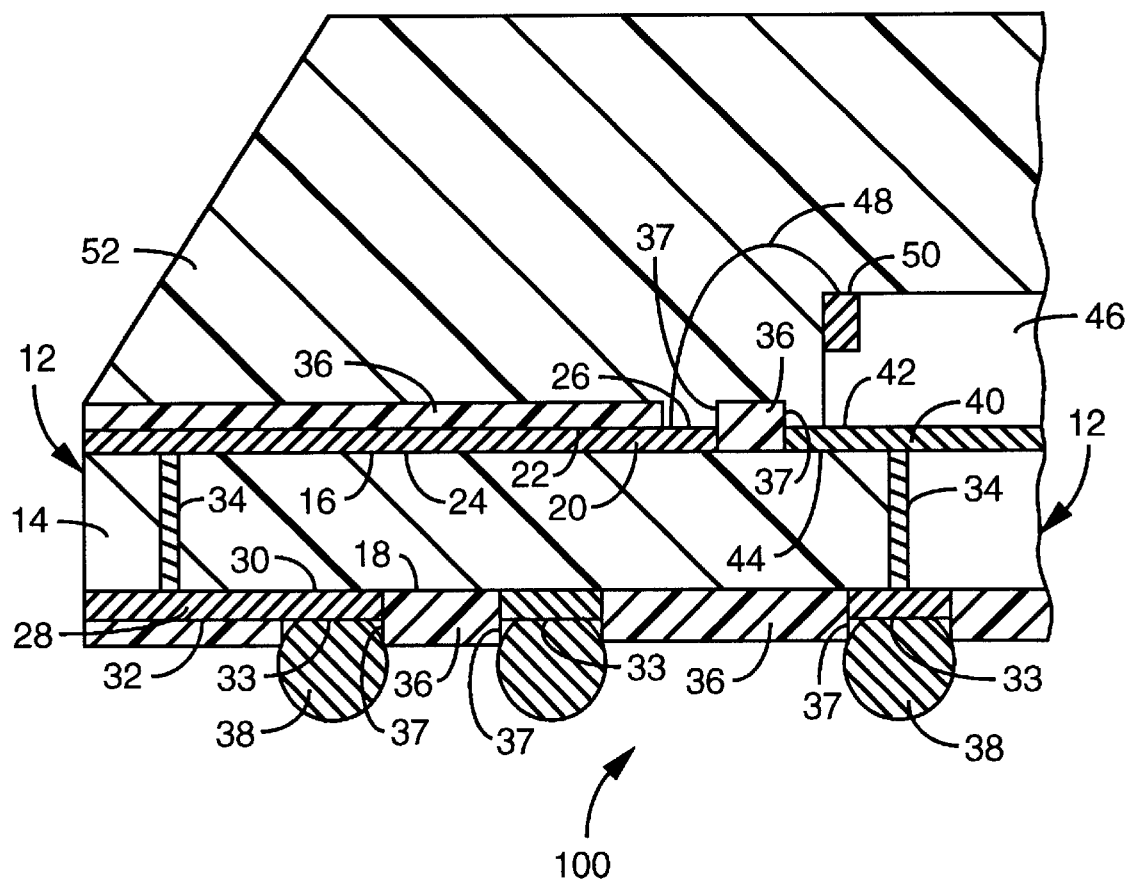
FIG. 3 is a cross-sectional side view of a semiconductor package formed using one of the package substrates of FIGS. 1 and 2.

FIGS. 1 and 2 are top and bottom plan views, respectively, of an exemplary substrate sheet 10 that includes a plurality of interconnected package substrates 12. Each package substrate 12 is a site for the assembly of a semiconductor package in a parallel assembly process. After assembly, the packages constructed on sheet 10 are singulated, such as with a saw, a laser, or a punch. FIG. 3 shows an exemplary package 100 so made.

The structure of the substrate sheet 10 and the individual package substrates 12 may vary. Referring to FIGS. 1–3, substrate sheet 10 includes rows and columns of interconnected package substrates 12 arranged in a matrix. Substrate sheet 10, and its package substrates 12 include an insulative core layer 14, a first surface 16, and an opposite second surface 18. Core layer 14 may be a glass fiber-filled epoxy laminate, a flexible polyimide tape, ceramic, or other conventional insulative materials.

First surface 16 and second surface 18 are overlaid with a layer of patterned metal. The metal is patterned into identical structures at each package substrate 12, such as chip pad 20 of first surface 16, and circuit patterns 20 and 28 on first surface 16 and second surface 18, respectively. In this example, chip pad 20 and circuit patterns 20, 28 are each formed from a layer of copper that is laminated, plated, or sputtered onto first and second surfaces 16, 18 of core layer 14. The copper layers are subsequently patterned by photolithography. The copper may be plated, in whole or in subpart only, with one or more layers of conventional plating metals, such as nickel, palladium, gold, silver, or combinations thereof, to facilitate bond wire or solder connections thereto. Of course, artisans will appreciate that the chip pad may be omitted, and the circuit patterns may be formed, at least in part, of other materials, such as aluminum or conductive ink As mentioned, the patterned metal layer of first surface 16 of each substrate 12 includes a planar chip pad 40, which is rectangular and has an outwardly oriented first surface 42 and an opposite second surface 44. Second surface 44 of chip pad 40 faces and is on first surface 16.

In FIG. 1, circuit patterns 20 are drawn only adjacent to one side of chip pad 20 for ease of view, but practitioners will appreciate that circuit patterns 20 may be adjacent to two or all four sides of chip pad 40, even though not shown in FIG. 1. The actual layout of the circuit patterns 20, including the number and form of the circuit patterns 20, will vary with the application.

The exemplary circuit patterns 20 of first surface 16 include a first surface 22 and an opposite second surface 24, which is on and facing first surface 16 of the package substrate 12. A bond finger 26 is at an inner end of each of the circuit patterns 20 adjacent to chip pad 40. Each circuit pattern 20 extends outwardly from bond finger 26 to one end of a metal via 34 that extends vertically through core layer 14. The circuit patterns 20 of one package substrate 12 of substrate sheet 10 may be integral with circuit patterns 20 of adjacent package substrates 12, which can allow for electroplating of the circuit patterns of the substrate sheet 10 in a single step and/or for electrostatic discharge protection. Ultimately, the circuit patterns 20 between the package substrates 12 are severed.

Second surface 18 of each package substrate 12 of substrate sheet 10 includes circuit patterns 28. FIG. 2 only shows a subset of the circuit patterns 28 for purposes of clarity of the drawing, but practitioners will appreciate that the arrangement of the circuit patterns 28 and their components will vary with the application.

The exemplary circuit patterns 28 of second surface 18 of the package substrates 12 of substrate sheet 10 include a first surface 30, which is on and facing second surface 18 of core layer 14, and an outwardly-oriented opposite second surface 32 (which may be plated). The respective circuit patterns 28 extend inwardly from a second end of via 34 to a round land 33 at an inner end of the circuit pattern 29. The circuit patterns 28 of one package substrate 12 of substrate sheet 10 may be integral with circuit patterns 28 of adjacent package substrates 12 for purposes of plating or grounding. The lands 33 are optionally arranged in rows and columns as in a BGA or land grid array (LGA) package.

The respective vias 34 electrically connect respective circuit patterns 20 to circuit patterns 28 through core layer 14 so that a conductive path exists between and electrically connects respective pairs of bond fingers 26 and lands 33. Vias 34 may also extend through core layer 14, between second surface 44 of chip pad 40 and one or more opposed lands 33. Accordingly, chip pad 40 may be electrically and thermally connected through the via(s) 34 and land(s) 33 to a reference voltage or a heat sink of a substrate upon which package 100 is mounted. Vias 34 may be formed by providing holes through core layer 14, such as by mechanical drilling, etching, or laserdrillig, and plating or filling the holes with metal.

Accordingly, each package substrate 12 of substrate sheet 10 includes a plurality of electrically conductive paths that extend from a first end (e.g., bond finger 26) adjacent to chip pad 40 through the package substrate 12 to a second end that terminates in an input/output terminal of the substrate (e.g., land 33).

Referring to FIG. 3, a layer 36 of an insulative nonphotoimageable solder mask material overlies first and second surfaces 16, 18 of package substrate 12. The solder mask layer 36 also overlies first surface 22 of circuit patterns 20 of first surface 16, and second surface 32 of circuit patterns 28 of second surface 18. However, bond fingers 26, first surface 42 of chip pad 40, and lands 33 are not covered by solder mask layer 36, but rather are each exposed through one of a plurality of appropriately-sized apertures 37 in solder mask layer 36.

Unlike the conventional photoimageable solder mask material described above in the Background section, solder mask layer 36 of FIG. 3 is not photoimageable because it does not contain the acrylates, photoinitiators, or any other materials that enable conventional solder mask material to be photoimaged through a, for example, silver halide mask, in a photolithography step. Sometimes, such a nonphotoimageable solder mask layer 36 is termed a "thermal" solder mask. On the other hand, by not including such acrylates and photoinitiators, solder mask layer 36 is not brittle, and is thus not subject to the cracking problem described above. For example, a solder mask material that is 100% epoxy may be used. As another example, S50 solder mask material from the TAIYO COMPANY of Japan may be used. Other vendors of such nonphotoimageable solder mask materials include the Mitsubishi and Ajinomoto companies of Japan.

Referring to FIGS. 1 and 2, after the circuit patterns 20, 28 and chip pad 40 are provided on each package substrate 12 of substrate sheet 10, the nonphotoimageable solder mask material is applied over the entire outer area of substrate sheet 10, including over all of first surface 16 and second surface 18 of substrate sheet 10. Accordingly, the layer of solder mask material 36 initially covers all of first surface 42 of chip pad 40, all of first surface 22 of circuit patterns 20, and all of second surface 32 of circuit patterns 28. The nonphotoimageable solder mask layer 36 may be applied by any conventional method, such as screening. An exemplary thickness of solder mask layer 36 as applied is approximately 25 to 30 micrometers.

After the nonphotoimageable solder mask layer 36 is applied to each of the interconnected package substrates 12 of substrate sheet 10, the nonphotoimageable solder mask layer 36 is cured. One manner of curing is by heating to a temperature of about 150 degrees Celsius for approximately 60 minutes.

After curing, the nonphotoimageable solder mask layer 36 is patterned using a laser ablation method, rather than the photolithography method used with the conventional photoimageable solder mask material described in the Background section above. The laser maybe operated, for instance, under the control of a computer, so as to aim the laser's beam on selected regions of the unpatterned nonphotoimageable solder mask layer 36. Through ablation, the laser makes precisely-sized and precisely-located apertures in nonphotoimageable solder mask layer 36 of FIG. 3. As an example, a $CO_2$ laser may be used.

Referring to FIG. 3, such laser-formed apertures 37 are formed through nonphotoimageable solder mask layer 36 using the above-mentioned laser ablation technique so as to expose first surface 42 of chip pad 40, first surface 22 of each circuit pattern 20 at bond finger 26, and second surface 32 of each circuit pattern 28 at land 33. The remainder of circuit patterns 20, 28, as well as first and second surfaces 16, 18 of each package substrate 12 of substrate sheet 10, remain covered by nonphotoimageable solder mask layer 36. Accordingly, first surface 42 of chip pad 40, bond fingers 26, and lands 33 are each exposed through a laser-formed aperture 37.

Subsequently, the process of assembling semiconductor package 100 of FIG. 3 proceeds with the connection of a semiconductor chip 46 to each package substrate 12 of substrate sheet 10. In this example, the semiconductor chip 46 is attached to the exposed first surface 42 of the chip pad 40 of each package substrate 12 of substrate sheet 10 within the superimposed aperture 37 through nonphotoimageable solder mask layer 26. Conventional chip attach methods, equipment, and materials may be used. For example, a viscous epoxy-based adhesive, an adhesive film, or an adhesive tape may be used.

After the adhesive is cured, a plurality of electrical conductors, such as bond wires 48, are provided. One of the bond wires 48 is used to electrically connect each of the bond pads 50 of chip 46 to the exposed first surface 22 of each circuit pattern 20 at bond finger 26 of package substrate 12 and through the superimposed aperture 37. Of course, the type of electrical conductors used can vary. For instance, chip 46 may be mounted flip chip style, and electrically connected to bond fingers 26 by reflowed solder balls.

Subsequently, an insulative encapsulant material is provided over each chip 46 on substrate sheet 10. Referring to FIG. 3, the encapsulant 52 covers all or a subpart of first surface 14 of the package substrate 12, and accordingly overlies chip 46, nonphotoimageable solder mask layer 36, bond wires 48, aperture 37, first surface 22 of circuit patterns 20 and exposed bond fingers 26. Typically, the encapsulant material is a plastic material, such as an epoxy-based material. An individual body of encapsulant 52 may be transfer molded over each package substrate 12 of substrate sheet 10, or a single block of encapsulant 52 may be molded over all of the package substrates 12 of substrate sheet 10. Other types of encapsulants, such a liquid encapsulant or glob top materials, also may be used. Subsequently, the encapsulant 52 is cured to harden.

After the encapsulant 52 is cured, optional solder balls 38 are fused onto the exposed second surface 32 of the circuit patterns 28 at each of the lands 33 of second surface 18 of the package substrates 12. Of course, solder balls 38 can be omitted, as in a LGA package. Subsequently, substrate sheet 10 is cut, such as by sawing or punching, around each package substrate 12 to singulate individual packages 100 of FIG. 3. Depending on where the encapsulant is located, the cutting step may sever both the substrate sheet 10 and the encapsulant material.

Use of the nonphotoimageable solder mask layer 36 is enabled by the use of laser ablation to form apertures 37 in nonphotoimageable solder mask layer 36. In this example, the apertures 37 are formed over chip pad 40, bond fingers 26, and lands 33, thereby exposing their respective outer surfaces for chip attachment, bond wiring, and optional solder ball forming steps, respectively.

Practitioners will appreciate that the structure and layout of the package substrate 12 is not in any way limiting of our invention, since the design of the package substrate is driven by the application. The nonphotoimageable solder mask layer 36 and laser ablation techniques taught herein may be widely used across many conventional package substrates, as well as to motherboards on which semiconductor packages are mounted.

For instance, the package substrates 12 of substrate sheet 10 may have a layer of patterned metal circuit patterns 20 on first surface 16 that includes both bond fingers 26 and lands 33, with no vias 34 and no circuit patterns 28 on second surface 18. The nonphotoimageable solder mask layer 36 on first surface 16 therefore would include apertures 37 for both bond fingers 26 and lands 33. Chip 46 may be suspended in a central aperture through package substrate by hardened encapsulant material.

This application has some similarities to U.S. patent application Ser. No. 09/888,950, filed on Jun. 25, 2001, which is incorporated herein by reference in its entirety.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a substrate including a first circuit pattern;
    a layer of an insulative solder mask material over the substrate and the first circuit pattern, wherein the layer of solder mask material includes at least one laser-formed aperture; and
    a semiconductor chip electrically connected to the first portion of the circuit pattern through the laser-formed aperture.

2. The semiconductor package of claim 1, wherein the solder mask layer is a nonphotoimageable material.

3. The semiconductor package of claim 2, further comprising a chip pad on the substrate, said chip pad having a first surface exposed through a laser-formed aperture in the nonphotoimageable solder mask layer, wherein the semiconductor chip is connected to the first surface through the laser formed aperture.

4. The semiconductor package of claim 1, wherein the insulative solder mask layer is an epoxy material devoid of acrylates and photoinitiator compounds.

5. A semiconductor package comprising:
    a substrate including an electrically conductive circuit pattern;
    a layer of an insulative nonphotoimageable solder mask material over the substrate and covering at least a portion of the circuit pattern, wherein at least a first portion of the circuit pattern is superimposed by a laser-formed aperture; and
    a semiconductor chip electrically connected to the circuit pattern.

6. The semiconductor package of claim 5, further comprising a chip pad on the substrate, said chip pad having a first surface exposed through a laser-formed aperture in the nonphotoimageable solder mask layer, wherein the semiconductor chip is connected to the first surface through the laser formed aperture.

7. The semiconductor package of claim 5, wherein the semiconductor chip is electrically connected to the circuit pattern through the laser-formed aperture.

8. The semiconductor package of claim 5, wherein the first portion of the circuit pattern superimposed by the laser-formed aperture is an input/output terminal of the semiconductor package.

9. The semiconductor package of claim 5, further comprising a solder ball fused to the first portion of the circuit pattern through the laser-formed aperture.

10. The semiconductor package of claim 5, wherein the semiconductor chip is electrically connected to the first portion of the circuit pattern through the laser-formed aperture.

11. A method of making a semiconductor package, the method comprising:
provyiding a substrate including a first circuit pattern and a layer of an insulative solder mask material over the substrate and the circuit pattern, wherein the layer of solder mask material includes at least one laser-formed aperture; and
electrically connecting a semiconductor chip to a first portion of the first circuit pattern through the laser-formed aperture.

12. The method of claim 11, further comprising covering the semiconductor chip, the first portion of the circuit pattern, and at least a portion of the substrate and solder mask with a plastic encapsulant.

13. The method of claim 12, wherein said covering step is performed by molding.

14. The method of claim 12, wherein the solder mask layer is a nonphotoimageable material.

15. The method of claim 11, wherein the solder mask layer is a nonphotoimageable material.

16. The method of claim 11, wherein the insulative solder mask layer is an epoxy based material devoid of acrylates and photoinitiator compounds.

17. A semiconductor package made using the method of claim 11.

18. A semiconductor package made using the method of claim 14.

19. A semiconductor package made using the method of claim 15.

20. A method of making an electrically interconnective substrate, the method comprising:

providing an insulative sheet including a plurality of conductive first circuit patterns on a first surface thereof;
applying a layer of an insulative nonphotoimageable solder mask material over the first circuit patterns; and forming
forming a plurality of apertures through the nonphotoimageable solder mask layer using a laser so as to expose a selected region of at least some of the first circuit patterns.

21. A circuit board comprising:
an insulative core layer with a metal first circuit pattern on an exterior surface thereof; and
a layer of an insulative nonphotoimageable solder mask material overlying the first circuit pattern, wherein the layer of solder mask material includes at least one laser-formed aperture exposing a portion of the first circuit pattern.

22. The circuit board of claim 21, further comprising a metal conductor electrically coupled to the exposed portion of the first circuit pattern through the laser-formed aperture.

23. The method of claim 11, wherein electrically connecting the semiconductor chip to the first portion of the first circuit pattern comprises coupling a metal conductor between the semiconductor chip and the first portion of the first circuit pattern, said metal conductor extending through the laser-formed aperture.

24. A method of making an electrical assembly, the method comprising:
providing a substrate including a first circuit pattern and a layer of an insulative material over the substrate and the circuit pattern, wherein the layer of the insulative material includes at least one laser-formed aperture exposing a portion of the circuit pattern; and
electrically connecting a metal conductor to the exposed portion of the first circuit pattern through the laser-formed aperture.

25. The method of claim 24, further comprising coupling a semiconductor chip to the substrate, and electrically connecting the metal conductor to the semiconductor chip.

26. The method of claim 24, further comprising applying the layer of the insulative material in a liquid state over the substrate, solidifying the layer of insulative material, and using a laser to form the laser-formed aperture in the solidified layer of the insulative material.

27. The method of claim 24, further comprising covering the insulative layer, the metal connector, and the laser formed aperture with a plastic encapsulant.

* * * * *